United States Patent [19]
Shih et al.

[11] Patent Number: 5,365,201
[45] Date of Patent: Nov. 15, 1994

[54] POWER SUPPLY INTERRUPTION CIRCUIT FOR AN AUDIO POWER AMPLIFIER

[76] Inventors: Kelvin Shih, 903 Devonshire, Brighton, Mich. 48116; Fu-Yih Shih, 9th Floor, 50.52, Min Chuan Rd., Hsin Tien, Taipei, Taiwan, Prov. of China

[21] Appl. No.: 79,127

[22] Filed: Jun. 16, 1993

[51] Int. Cl.$^5$ .......................... H03F 1/02; H03F 3/04; H02H 7/20; G11B 7/125
[52] U.S. Cl. ..................... 330/298; 330/297; 330/207 P; 327/322; 327/538
[58] Field of Search .............. 330/51, 297, 298, 207 P; 307/200, 258

[56] References Cited

U.S. PATENT DOCUMENTS

| | | |
|---|---|---|
| 3,898,532 | 8/1975 | Frank . |
| 4,057,767 | 11/1977 | Laupman . |
| 4,296,278 | 10/1981 | Cullison et al. . |
| 4,355,341 | 10/1982 | Kaplan . |
| 4,427,951 | 1/1984 | Amada et al. ............ 330/297 |
| 4,484,150 | 11/1984 | Carver ..................... 330/297 |
| 4,486,720 | 12/1984 | Hirano . |
| 4,631,713 | 12/1986 | Romeas et al. .......... 369/54 |

Primary Examiner—William L. Sikes
Assistant Examiner—Fetsum Abraham
Attorney, Agent, or Firm—Brooks & Kushman

[57] ABSTRACT

This invention provides an automatic current interruption to protect the audio power amplifier circuitry when current conditions above the capacity of the power amplifier are encountered. The circuit monitors the current supplied to the power amplifier and utilizes a transistor to interrupt power amplifier output. Power output is latched in its interrupted state until reset and is capable of quickly and effectively shutting down power supply output.

11 Claims, 5 Drawing Sheets

POWER SUPPLY INTERRUPTION CIRCUIT FOR AN AUDIO POWER AMPLIFIER

TECHNICAL FIELD

This invention relates to audio power amplifiers and more particularly to power transistor protection circuitry.

BACKGROUND ART

Audio reproduction systems generally consist of three parts. The first part is an audio source such as a phono turntable, a tape player, a disc player or an RF tuner for retrieving audio information and converting it to an electrical signal. The second part of the audio system is the loudspeaker. Loudspeakers serve to convert these electrical signals to acoustic waves to enable them to be perceived by a listener. Loudspeakers typically require a considerable amount of electrical power to create the sound pressure levels necessary for enjoyable listening. The third part of the audio system is a power amplifier. The power amplifier amplifies the electrical signals from the audio source and supplies the current necessary to drive the loudspeakers.

The heart of a modern power amplifier is an amplifier or series of amplifiers for supplying the current necessary to drive the loudspeakers. The power amplifier may consist of a transformer, vacuum tubes, BJT power transistors, MOSFET power transistors or other similar devices. Problems occur if the power capacity of the power amplifier is exceeded. If the power capacity is exceeded, catastrophic failure of the power amplifier can occur. Exceeding the power capacity of the power amplifier may also produce catastrophic failure of the loudspeakers.

Those skilled in the art of audio system design are aware of several methods of protecting the audio amplifier circuitry. One method is by the use of a traditional fuse or circuit breaker device. If the current flowing through the power transistors exceeds a certain pre-set amount, the current either blows the fuse or trips the circuit breaker providing an open circuit, thereby reducing the current to zero. One disadvantage of these systems is that they are relatively slow to respond. In some cases, the damage to the power amplifier has already occurred by the time the fuse or circuit breaker opens the circuit.

Other power amplifier systems such as U.S. Pat. No. 4,355,341 to Kaplan and U.S. Pat. No. 4,057,767 to Laupman utilize solid state circuitry on the output of the power amplification stage to sense the output current and either deactivate the input to the power amplification stage or deactivate the power amplification stage itself. The disadvantages of these systems are that the act of sensing the output current, by definition, distorts the output signal supplied to the loudspeakers. Any distortion of the output is undesired.

Alternate approaches are disclosed by U.S. Pat. No. 3,898,532 to Frank, U.S. Pat. No. 4,296,278 to Cullison et al., and U.S. Pat. No. 4,486,720 to Hirano which present methods whereby the audio amplifier circuitry is protected by either disconnecting the load from the power amplifier or by inserting a resistor in series with a load thereby reducing the power to the load. These systems also suffer the disadvantage of sensing the output current and thereby perturbing the output signal to the loudspeakers. Further, these systems also risk damage to the audio amplifier circuitry due to the manner in which they alter the load to the circuitry. Certain power transistor configurations can be adversely affected operating in a no-load condition. Other configurations are sensitive to drastic transitions between load and no-load, or load and reduced load conditions.

SUMMARY OF THE INVENTION

It is an object of the present invention to provide audio power amplifier protection from over current conditions by means of a power supply with active circuitry which senses these conditions and quickly shuts down power to the power amplification stage at its source.

It is another object of the present invention to provide a power supply for an audio power amplifier having the ability to sense the output current of the power supply and compare the magnitude of this current to a preset level. If the magnitude of the supply current exceeds the preset level, the power supply is latched in a disabled mode using a flip-flop circuit until a reset signal is received.

A further object of the present invention is to provide a dual level power supply for a audio amplifier comprising both a positive and an negative supply. The current output of these positive and negative supplies are monitored and the magnitudes of these currents are each compared to a preset level. If the magnitude of the current of either the positive supply or the negative supply exceeds its respective preset level, both the positive and negative supply are latched in a disabled mode until a reset signal is received.

Other features and advantages of the invention will be apparent from the following description and claims and are illustrated in the accompanying drawings which show circuits embodying the preferred features of the present invention and the principles thereof, in what is now considered to be the best mode in which to apply these principles.

BRIEF DESCRIPTION OF THE DRAWINGS

In the accompanying drawings forming a part of the specification, in which like numerals are employed to designate like parts throughout the same.

BEST MODE FOR CARRYING OUT THE INVENTION

Figure 1:
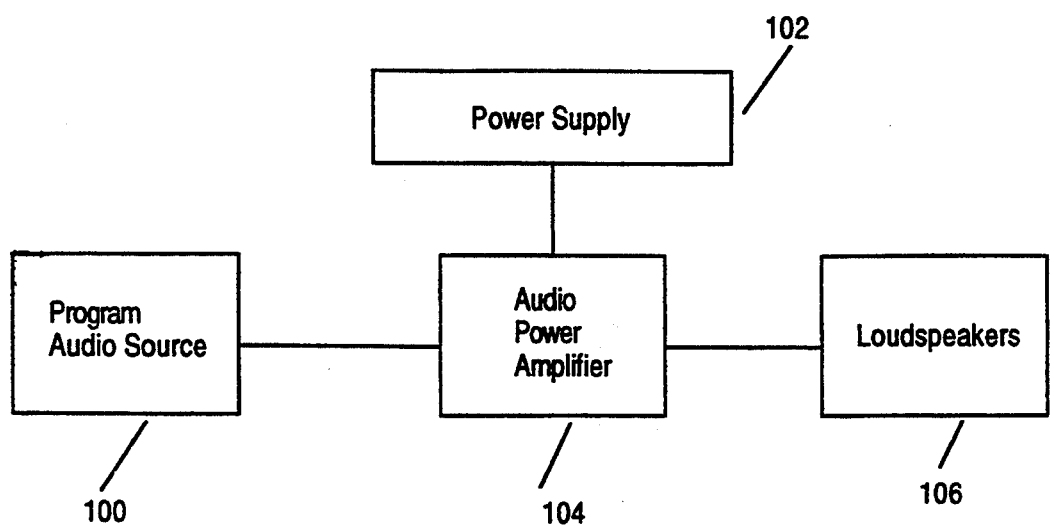
FIG. 1 is a block diagram of an audio system including the power supply of the present invention.

Referring to FIG. 1, audio source 100 supplies an electrical signal representative of audio information to audio power amplifier 104. This amplifier amplifies the signals from the audio source and supplies sufficient current to drive loudspeakers 106. These loudspeakers convert the amplified electrical signal into sound. Power supply 102 supplies the voltage and current required by audio power amplifier 104.

Figure 2:
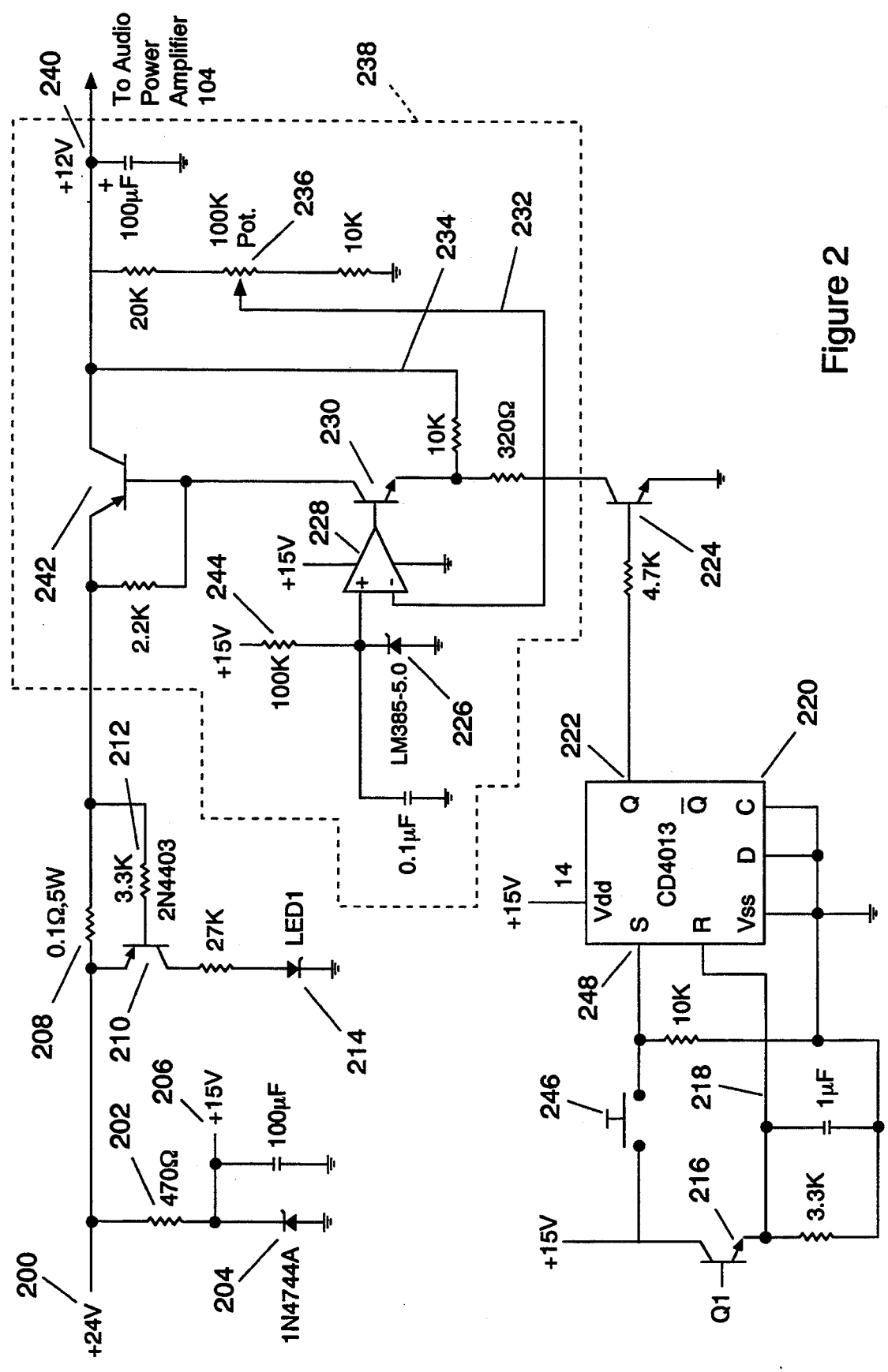
FIG. 2 is a detailed schematic diagram of one embodiment of the power supply of the present invention.

Referring to FIG. 2, one embodiment of power supply 102 is shown as a circuit diagram. Power source 200 is a 24 volt unregulated voltage with sufficient current capability to drive audio power amplifier 104. Supply circuit 202 provides crude regulation of the 24 volt unregulated signal by means of zener diode 204. The result is a 15 volt signal 206 which is crudely regulated and serves as a power supply to other elements in the power supply circuit.

The current drawn from the supply ms sensed via current sensing resistor 208. The voltage drop across resistor 208 is proportional to the supply current allowing the voltage to be considered a supply current signal. Transistor 210 serves as a comparator, such that, once the supply current signal reaches a level sufficient to turn transistor 210 on, based upon the choice of the value of resistor 212, transistor 210 conducts current from its emitter to its collector generating a current limit signal. This current flow through transistor 210 causes light-emitting diode 214 to emit light. This light provides an optical feedback path to phototransistor 216, causing it to conduct. Phototransistor 216 is configured in a common collector configuration, such that, when it conducts, its output 218 approaches the 15 volt supply. The logic high voltage level is transmitted to the reset line of set-reset flip-flop 220. This causes the Q output 222 of the set-reset flip-flop 220 to drop to a logic low level close to 0 volts. This logic low signal is fed to switch transistor 224. The effect of this logic low signal is to turn off transistor 224 and interrupt current flow from the collector to the emitter. This interruption in current flow disables regulator 238 and cuts the source of power 240 to power amplifier 104.

Regulator 238 functions as follows. Darlington power transistor 242 serves the control function of supplying current to audio power amplifier 104 via node 240. This power transistor is controlled via voltage reference 244 which includes 5 volt zener diode 226. This 5 volt reference voltage is fed to the non-inverting input of operational amplifier 228 whose output drives the base of current augmentation transistor 230. Dual feedback loops 232 and 234 serve to monitor the supply voltage and maintain the supply voltage at a constant voltage level. The supply voltage level is adjustable via potentiometer 236.

Once voltage regulator 238 is disabled, current flow ceases through current sensing resistor 208 and the supply current signal generated by the current sensing resistor becomes zero. Transistor 210 turns off and current flow between the collector and emitter of transistor 210 ceases turning off light-emitting diode 214. Phototransistor 216 is turned off causing its output node 218 to drop to a voltage of approximately zero, a logic low value. The output 222 of set-reset flip-flop 220 remains at a logic low value until set input 248 is brought high by the activation of single-pole momentary contact switch 246 which connects set input 248 to the 15 volt supply. This brings the Q output 222 of set-reset flip-flop 220 to a logic high state. Transistor switch 224 is turned on which activates voltage regulator 238, returning the power supply to normal operation.

Figure 3:
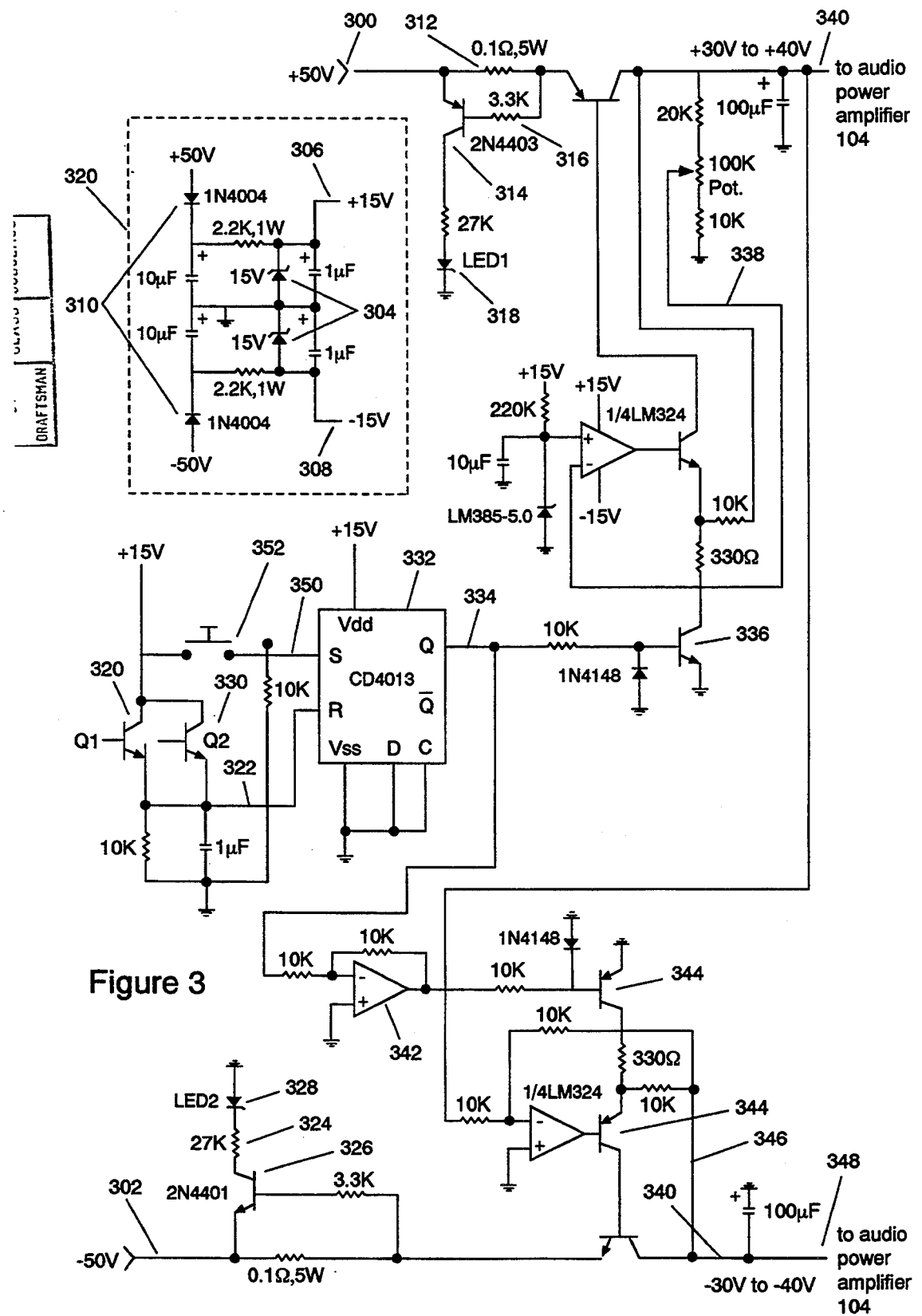
FIG. 3 is a detailed schematic diagram of a second embodiment of the power supply circuit of the present invention.

Turning now to FIG. 3, an alternate embodiment of the invention consisting of a dual-level positive and negative power supply for audio power amplifier 104 is illustrated. Power sources 300 and 302 are a +50 volt unregulated voltage and a −50 volt unregulated voltage, respectively, both with sufficient current capability to drive audio power amplifier 104. Supply circuit 302 provides crude regulation of these +50 and −50 volt unregulated signals by means of zener diodes 304. The result is a +15 volt source 306 and −15 volt source 308 which serve as a power supply to other elements in the power supply circuit. Diodes 310 protect the other elements in the power supply circuit during high current conditions.

The current drawn from the positive supply is sensed via current sensing resistor 312. The voltage drop across resistor 312 is proportional to the positive supply current. Thus, this voltage can be considered a positive supply current signal. Transistor 314 serves as a comparator, such that, once the supply current signal reaches a level sufficient to turn transistor 314 on, transistor 314 conducts current from its emitter to its collector generating a positive current limit signal. Current flow through transistor 314 causes light-emitting diode 318 to emit light. This light provides an optical feedback path to phototransistor 320, causing it to conduct. Similarly, circuit 324 provides the same function for the negative supply, generating a negative current limit signal generated by transistor 326. This negative current limit signal is fed back via light-emitting diodes 328 to phototransistor 330, causing it to conduct. Phototransistors 320 and 330 are configured in a common collector configuration, such that, when either of these transistors are conducting, the level of output 322 approaches the 15 volt supply. This voltage level, a logic high, is transmitted to the reset line of a set-reset flip-flop 332. This causes the Q output 334 of the set-reset flip-flop to drop to a logic low level close to 0 volts. The logic low signal from the flip-flop is fed to transistor 336 which is configured as a switch. The effect of this logic low signal is to effectively turn off transistor 336 and interrupt current flow from the collector to the emitter. This drop in current flow disables positive regulator 338 and cuts the source of positive power 340 to power amplifier 104. At the same time, the logic low signal is inverted via inverting amplifier circuit 342. A logic high signal at the output of this inverting amplifier causes transistor 344 to conduct thereby disabling negative voltage regulator 346 and cutting the source of negative power 348 to power amplifier 104.

Positive regulator 338 functions in a manner substantially similar to regulator 238 in FIG. 2. Negative regulator 346 also functions in a similar manner, except that instead of providing a fixed reference voltage input and an output voltage adjustment, the regulator input is drawn from the output of the positive supply 340, such that, negative regulator 346 will supply negative voltage of equal magnitude to the positive supply voltage.

Once positive voltage regulator 338 and negative voltage regulator 346 are disabled, current flow ceases through current sensing resistor 312 and the supply current signal generated by the current sensing resistor becomes zero. Transistor 314 turns off and current flow between the collector and emitter ceases, causing the light-emitting diode 318 to stop emitting. This turns off phototransistor 320. Circuit 324 for the negative supply provides a similar function and transistor 330 is also turned off. Output node 322 of these transistors drops to a voltage of approximately zero, a logic low value. The output 334 of set-reset flip-flop 332 remains in a logic low level, until set input 350 is switched to a high state by the activation of single-pole momentary contact switch 352 which connects set input 350 to the 15 volt supply. This brings the Q output 334 of set-reset flip-flop 332 to a logic high state which turns on transistor switches 336 and 344 to activate positive voltage regulator 338 and negative voltage regulator 346, returning the power supply to normal operation.

It should be noted that in normal operation, an overcurrent condition detected by either the positive supply or the negative supply will result in disabling both the positive and negative power supplies. This is an important feature for a power supply intended for use with an audio power amplifier. If the positive power supply were to be disabled while the negative power supply were still active, many power amplifiers would produce an output to a normal audio signal which was clipped on the positive side at a value of zero volts. This would provide an output signal with a net negative DC value which, when fed to the loudspeakers, could prove to be harmful to their operation. Similarly, if the negative power supply were to be disabled while the positive power supply were still active, this could prove to be harmful to loud speaker operation.

Figure 4:
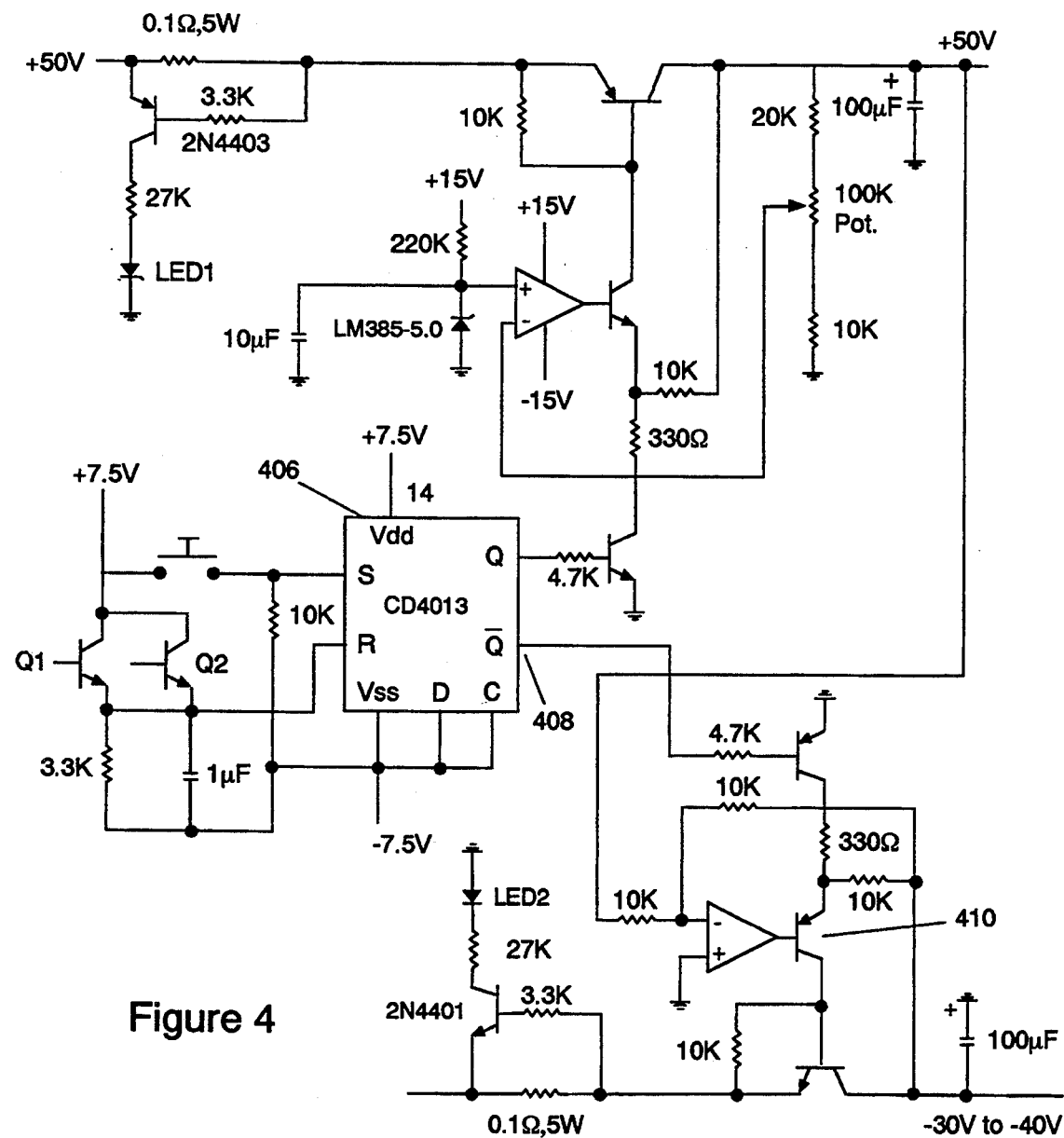
FIG. 4 is a detailed schematic diagram of a third embodiment of the power supply circuit of the present invention.
Figure 4:
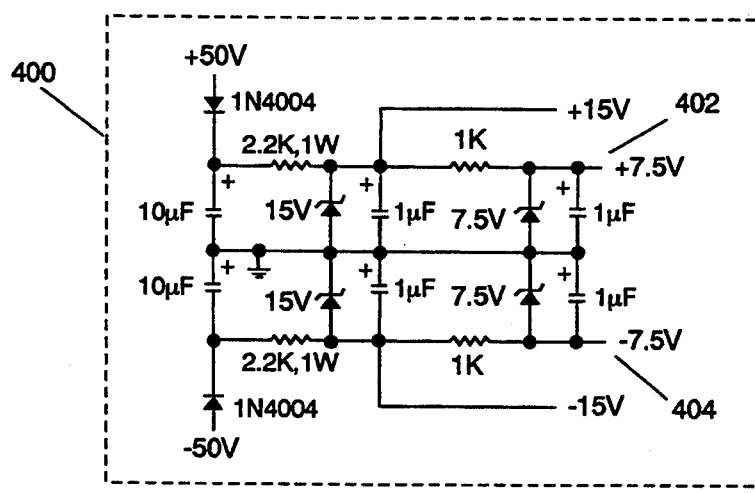

Referring to FIG. 4, an alternate embodiment of the invention is illustrated which is similar to the dual level positive and negative power supply disclosed in FIG. 3. The differences are that supply circuit 400 supplies a crudely regulated 7.5 volt voltage 402 and a crudely regulated negative 7.5 volt voltage 404. These two additional voltages are supplied to set-reset flip-flop 406. By incorporating a negative supply vol-voltage, transistor 410 can be fed directly from the $\overline{Q}$ output 408 of the set-reset flip-flop.

Figure 5:
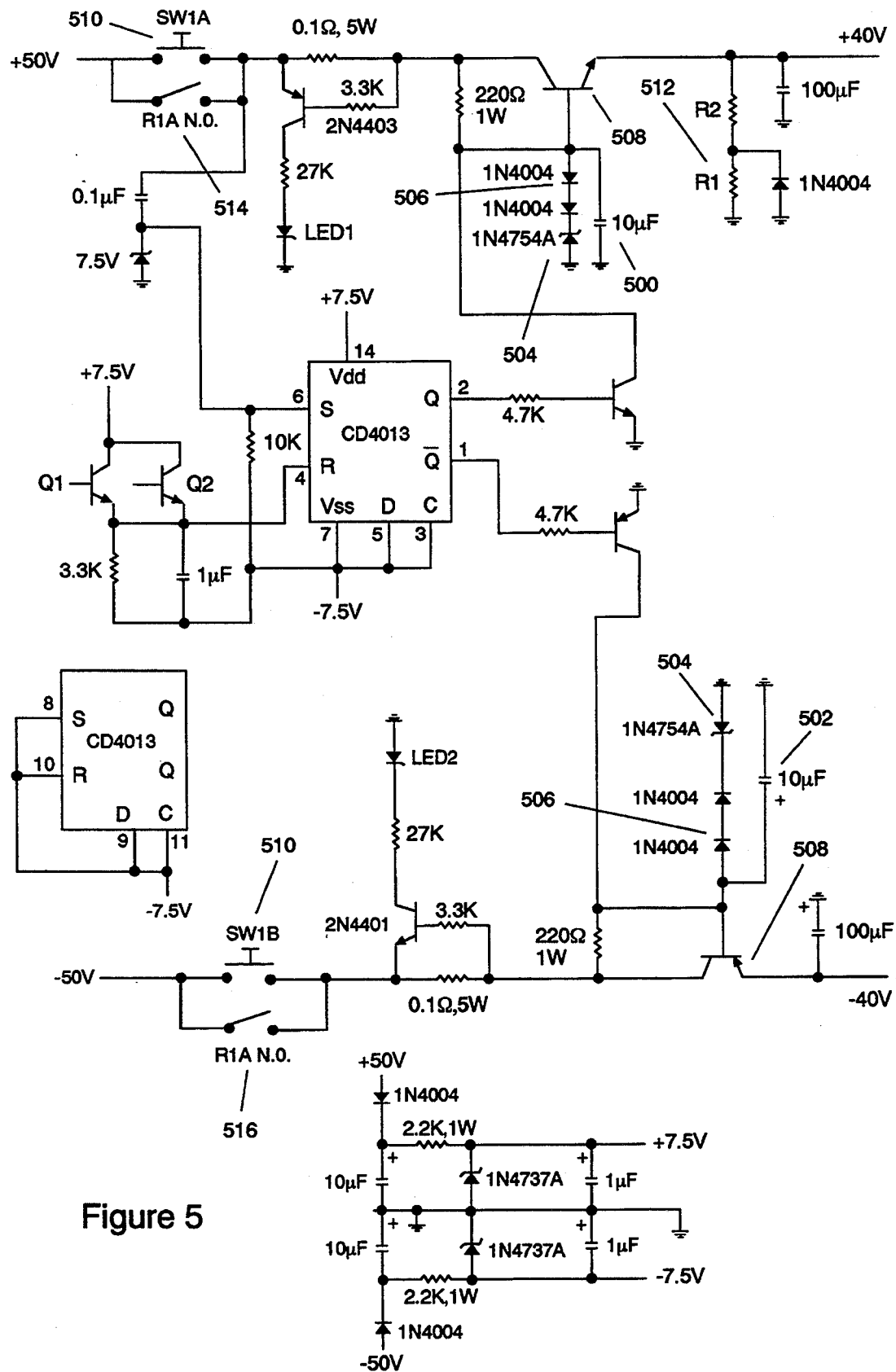
FIG. 5 is a detailed schematic diagram of a fourth embodiment of the power supply circuit of the present invention.

Referring now to FIG. 5, a fourth embodiment of power supply 102 is shown. The circuit incorporates a simplified configuration for positive regulator 500 and negative regulator 502. The voltage reference for these regulators are supplied by zener diodes 504. A series of diodes 506 provide a voltage drop substantially equal to the voltage drop from base to emitter during operation of each of the Darlington power transistors 508. This configuration reduces the number of components of the regulator circuit. However, it does not provide the same level of regulation provided by the earlier circuits. A further difference between this embodiment and other embodiments of the invention is that a relay is provided to latch the output of both the positive and the negative power supplies in a disabled condition until manually reset. To manually reset the amplifier, a double-pole momentary contact switch 510 activates the positive and negative supplies. This provides a voltage drop across relay coil 512 and holds relay contacts 514 and 516 closed, thereby continuing operation of the positive and negative supplies after switches 510 have been opened. Once the positive supply has been disabled by either a high current condition in the positive supply or in the negative supply, the voltage to relay coil 512 falls and switches 514 and 516 are opened leaving both positive and negative supplies in a disabled condition. These supplies can be activated once again by closing switches 510.

While the best mode for carrying out the invention and several alternative modes have been described in detail, those familiar with the art to which this invention relates will realize that additional alternative designs and embodiments are possible. The preceding descriptions are intended to be understood as examples and not as limitations of the invention. The broad scope of the invention is intended to be defined by the following claims.

What is claimed is:

1. A power supply for an audio amplifier having at least one power transistor, said power supply comprising:
   supply means for supplying a voltage to one or more power transistors;
   current sensing means for sensing the current output of the supply means and generating a supply current signal;
   comparison means for comparing the magnitude of the supply current signal to a preset level;
   generating means for generating a current limit signal if the magnitude of the supply current signal exceeds the preset level;
   control means responsive to the current limit signal for disabling the supply means, said control means comprising a transistor;
   reset means for manually generating a reset signal; and
   latching means responsive to the reset means for holding the supply means in a disabled condition until the reset signal is present, said latching means comprising a flip-flop circuit.

2. The invention of claim 1 further comprising optical feedback means for optically transmitting the current limit signal to the control means.

3. The invention of claim 1 wherein the comparison means comprises a comparator circuit-.

4. A power supply for an audio amplifier having output transistors, said power supply comprising:
   positive supply means for supplying a positive voltage to one or more output transistors;
   negative supply means for supplying a negative voltage to one or more output transistors;
   current sensing means for sensing the current output of both the positive supply means and negative supply means and generating a positive supply current signal and a negative supply current signal;
   first comparison means for comparing the magnitude of the positive supply current signal to a first preset level;
   second comparison means for comparing the magnitude of the negative supply current signal to a second present level;
   first generating means for generating a positive current limit signal if the magnitude of the positive supply current signal exceeds the first preset level;
   second generating means for generating a negative current limit signal if the magnitude of the negative supply current signal exceeds the second preset level; and
   control means for disabling both the positive supply means and negative supply means, responsive to either the positive current limit signal or the negative current limit signal.

5. The invention of claim 4 further comprising optical feedback means for optically transmitting the positive current limit signal and the negative current limit signal to the control means.

6. The invention of claim 4 further comprising:
   reset means for manually generating a reset signal; and
   latching means responsive to the reset means for holding the positive supply means and negative supply means in a disabled condition until the reset signal is present.

7. The invention of claim 4 wherein the comparison means comprises a comparator circuit.

8. The invention of claim 4 wherein the control means comprises a transistor.

9. A power supply for an audio amplifier having output transistors, said power supply comprising:
- a positive voltage regulator for supplying a positive voltage to one or more output transistors;
- a negative voltage regulator for supplying a negative voltage to one or more output transistors;
- current sensor for sensing the current output of both the positive voltage regulator and negative voltage regulator and generating a positive supply current signal and a negative supply current signal;
- first comparator circuit for comparing the magnitude of the positive supply current signal to a first preset level;
- second comparator circuit for comparing the magnitude of the negative supply current signal to a second preset level;
- first current generator for generating a positive current limit signal if the magnitude of the positive supply current signal exceeds the first preset level;
- second current generator for generating a negative current limit signal if the magnitude of the negative supply current signal exceeds the second preset level;
- a transistor responsive to either the positive current unit signal or the negative current unit signal for disabling both the positive voltage regulator and negative voltage regulator;
- a light-emitting diode for optically transmitting the positive current limit signal and the negative current limit signal;
- a photodetector responsive to the light-emitting diode for controlling the current flow of both the positive voltage regulator and negative voltage regulator;
- a reset switch for manually generating a reset signal; and
- a latch responsive to the reset switch for holding the positive voltage regulator and negative voltage regulator in a disabled condition until the reset signal is present.

10. An audio power amplifier having at least one power transistor, said power amplifier comprising:
- a positive voltage regulator for supplying a positive voltage to one or more output transistors;
- a negative voltage regulator for supplying a negative voltage to one or more output transistors;
- a current sensor for sensing the current output of both the positive voltage regulator and negative voltage regulator and generating a positive supply current signal and a negative supply current signal;
- first comparison circuit for comparing the magnitude of the positive supply current signal to a first preset level;
- second comparison circuit for comparing the magnitude of the negative supply current signal to a second preset level;
- first current generator for generating a positive current limit signal if the magnitude of the positive supply current signal exceeds the first preset level;
- second current generator for generating a negative current limit signal if the magnitude of the negative supply current signal exceeds the second preset level;
- a transistor responsive to either the positive current unit signal or the negative current unit signal for disabling both the positive voltage regulator and negative voltage regulator;
- a light-emitting diode for optically transmitting the positive current limit signal and the negative current limit signal;
- a photodetector responsive to the light-emitting diode for controlling the current flow of both the positive voltage regulator and negative voltage regulator;
- a reset switch for manually generating a reset signal; and
- a latch responsive to the reset switch for holding the positive voltage regulator and negative voltage regulator in a disabled condition until the reset signal is present.

11. An audio amplifier having output transistors, said audio amplifier comprising:
- a positive voltage regulator for supplying a positive voltage to one or more output transistors;
- a negative voltage regulator for supplying a negative voltage to one or more output transistors;
- current monitoring means for monitoring the current output of both the positive voltage regulator and the negative voltage regulator and generating a control signal if either the magnitude of the positive supply current exceeds a first preset level or the magnitude of the negative supply current exceeds a second preset level, said current monitoring means comprising at least one optical feedback link;
- control means responsive to the control signal for disabling both the positive voltage regulator and the negative voltage regulator;
- reset means for manually generating a reset signal; and
- latching means responsive to the reset means for holding the positive voltage regulator and the negative voltage regulator in a disabled condition until the reset signal is present.

* * * * *